United States Patent
Albrecht et al.

(10) Patent No.: US 6,181,561 B1
(45) Date of Patent: Jan. 30, 2001

(54) HEAT SINK HAVING STANDOFF BUTTONS AND A METHOD OF MANUFACTURING THEREFOR

(75) Inventors: Louis R. Albrecht, Encinitas, CA (US); James J. Hansen, Rockwall; Steven A. Shewmake, Mesquite, both of TX (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/244,673

(22) Filed: Feb. 4, 1999

(51) Int. Cl.$^7$ ........................................ H05K 7/20
(52) U.S. Cl. .......................... 361/719; 29/845; 361/704
(58) Field of Search .................... 29/760, 845, 837; 257/706, 707, 713, 723, 724; 165/80.3, 185; 174/35 R, 16.3, 252; 361/704, 709–711, 717–719, 816, 818

(56) References Cited

U.S. PATENT DOCUMENTS

| | | | |
|---|---|---|---|
| 4,321,423 | * | 3/1982 | Johnson . |
| 4,577,402 | * | 3/1986 | Swanstrom . |
| 4,625,260 | * | 11/1986 | Jordan . |
| 4,884,336 | * | 12/1989 | Waters . |
| 5,035,049 | * | 7/1991 | Wheeler . |
| 5,280,412 | * | 1/1994 | Podell . |
| 5,818,698 | * | 10/1998 | Olson . |
| 5,894,408 | * | 4/1999 | Stark . |

FOREIGN PATENT DOCUMENTS

| | | |
|---|---|---|
| 76 07 712 | 12/1976 | (DE) . |
| 94 11 025 | 9/1994 | (DE) . |
| 0 863 694 A1 | 9/1998 | (EP) . |

* cited by examiner

*Primary Examiner*—Gerald Tolin

(57) ABSTRACT

The present invention provides a method of manufacturing a heat sink for use with a circuit board having a predetermined thickness and an opening formed therein. In one particularly embodiment the method comprises forming a heat sink body, forming a support shoulder in the heat sink body by protruding a portion of the heat sink body to a predetermined first height, and forming a button shoulder in the heat sink body by protruding a portion of the support shoulder to a predetermined second height. Preferably, the heat sink body comprises aluminum or aluminum alloy. However, it should, of course, be recognized that other extrudable or malleable materials may be used in place of aluminum or its alloys. Additionally, it should be understood that a plurality of such support shoulders and button shoulders may be formed to provide a plurality of coupling points with the circuit board, which could also have a corresponding number of openings.

12 Claims, 5 Drawing Sheets

HEAT SINK HAVING STANDOFF BUTTONS AND A METHOD OF MANUFACTURING THEREFOR

TECHNICAL FIELD OF THE INVENTION

The present invention is directed, in general, to a heat sink and, more specifically, to a heat sink having standoff buttons and a method of manufacture therefor.

BACKGROUND OF THE INVENTION

One of the concerns of circuit designers is the control of circuit or component heat generated during operation of an electronic circuit. Such control is necessary in order to prevent component or circuit failure caused by a heat build up. The generally preferred method to control circuit and component heat is to dissipate it into the atmosphere before it can build up to damaging levels. In order to do this, designers will usually associate the components or circuit with a heat sink to absorb heat from the component or circuit and radiate it into the atmosphere.

Heat sinks are generally made of a material with favorable heat transfer, or thermal conductive, characteristics; that is, the material must be able to absorb heat and radiate it into the surrounding atmosphere in an efficient manner. Several metals have favorable thermal conductive characteristics, including copper, aluminum, steel, and their alloys. Any one of these materials can be used as a heat sink, but aluminum is generally the preferred material because copper is expensive and steel is not very malleable.

Heat sinks are made in a variety of shapes and sizes and several methods exist for combining heat sinks with circuits or components. Sometimes the heat sink is mounted directly to the heat generating component while at other times the entire circuit will be associated with a single heat sink. In the case of circuits mounted on small printed circuit or wiring boards, the entire circuit or wiring board will frequently have a single heat sink mounted on it. In most cases printed wiring and circuit boards that are small in size will require a single heat sink consisting of a single sheet of metallic material, such as aluminum, shaped to conform to the circuit with which it will be associated. Using prior art, the heat sink will be fastened to the circuit by a method or mechanism that will leave an air space for insulation purposes between the circuit board and the heat sink in order to prevent the metallic heat sink from shorting the circuit on the printed circuit or wiring board.

In many conventional devices, if a small flat printed wiring or circuit board is required to be associated with a heat sink, then a flat piece of aluminum of approximately the same size as the circuit board is designated for use as a heat sink. The circuit or wiring board and heat sink are typically mounted so they directly oppose each other. When in this configuration, the heat sink is able to absorb heat emitted by the circuit and components mounted on the board. The heat sink is typically held in place by using any one of several well recognized fastening means, such as clips, screws, pins, or bolts. Additionally, in order to keep the heat sink from coming into direct contact with the circuit or wiring board, spacers are used to keep the circuit board and the heat sink separated.

These conventional assemblies require several small parts that must meticulously be assembled, which generally means the manufacturing process is slower and more costly. Additionally, a number of assemblies are typically rejected for quality control reasons when numerous small parts are used because of the ease with which a part may be inadvertently omitted or come apart due to vibration and handling that occurs during the remainder of the assembly process.

Accordingly, what is needed in the art is a heat sink that can be associated with a circuit requiring heat control that has a simple attachment method and uses substantially fewer parts than prior art methods.

SUMMARY OF THE INVENTION

To address the above-discussed deficiencies of the prior art, the present invention provides a method of manufacturing a heat sink for use with a circuit board having a predetermined thickness and an opening formed therein. In one particularly advantageous embodiment the method comprises forming a heat sink body, forming a support shoulder in the heat sink body by protruding a portion of the heat sink body to a predetermined first height, and forming a button shoulder in the heat sink body by protruding a portion of the support shoulder to a predetermined second height. Preferably, the heat sink body comprises aluminum or aluminum alloy. However, it should, of course, be recognized that other extrudable or malleable materials may be used in place of aluminum or its alloys. Additionally, it should be understood that a plurality of such support shoulders and button shoulders may be formed to provide a plurality of coupling points with the circuit board, which could also have a corresponding number of openings.

Thus, in a broad scope, the present invention provides a novel heat sink attachment system and method for manufacturing that attachment system. For example, the support shoulder and the button shoulder can be easily manufactured by double drawing the metal heat sink body with a die, such as a die on a progressive die press. Alternatively, of course, the heat sink body may be extruded to form the support shoulder and the button shoulder. Because there are no assembly parts required, manufacturing time and cost are substantially reduced. Additionally, the because of the ease with which the support shoulder and the button shoulder can be formed, mass production of the heat sink is easily accomplished.

The present method invention may further include forming an outer diameter of the button shoulder that is less than an inner diameter of the opening. This aspect allows for easy insertion of the button shoulder into the opening. In another aspect, the forming a support shoulder includes forming a spacer shoulder having a protrusion height that provides a maximum design distance of separation between the heat sink and the circuit board. Typically, electronic components will be attached to the same side of the circuit board on which the heat sink is mounted. In such instances, the spacer shoulder's height is such that the electronic component is thermally coupled to the heat sink when it is mounted on the circuit board. In some instances, the electronic component is thermally coupled to the heat sink by way of a thermal conducting silicon gel, such as a diamond filled silicon. Thus, the support shoulder also serves as a spacer to provide the required distance of separation between the circuit board and the heat sink.

In another embodiment, forming the button shoulder to a predetermined second height includes forming a button shoulder to height that does not substantially exceed the thickness of the circuit board. What is meant by not substantially exceeding the thickness of the circuit board means that the protruding portion of the button shoulder does not protrude far enough above the circuit board such that it will bend over onto circuit board when a spreading force is applied against the button shoulder.

In another aspect, the present invention provides a method of manufacturing a circuit board. In this particular embodiment, the method includes forming a circuit board having an opening therein and a predetermined thickness, forming a heat sink body, inserting the protruding portion of the button shoulder into the opening and applying a force against the protruding portion to increase a diameter thereof and effectuate a frictional holding force of the button shoulder against an interior diameter of the opening. In this embodiment, forming a heat sink includes forming a support shoulder in the heat sink body by protruding a portion of the heat sink body to a predetermined first height and forming a button shoulder in the heat sink body by protruding a portion of the support shoulder to a predetermined second height.

In yet another aspect, the present invention provides a heat sink for use with a circuit board having a predetermined thickness and an opening formed therein. The heat sink comprises a heat sink body, a support shoulder formed in a surface of the heat sink body that has a predetermined first height, and the heat sink further includes a button shoulder formed in the support shoulder that has a predetermined second height.

Another aspect of the present invention is directed to a circuit board that comprises a circuit board that has an opening therein and a predetermined thickness, a heat sink body that includes a support shoulder formed in the heat sink body that has a predetermined first height, and further includes a button shoulder formed in the heat sink body and having a predetermined second height.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
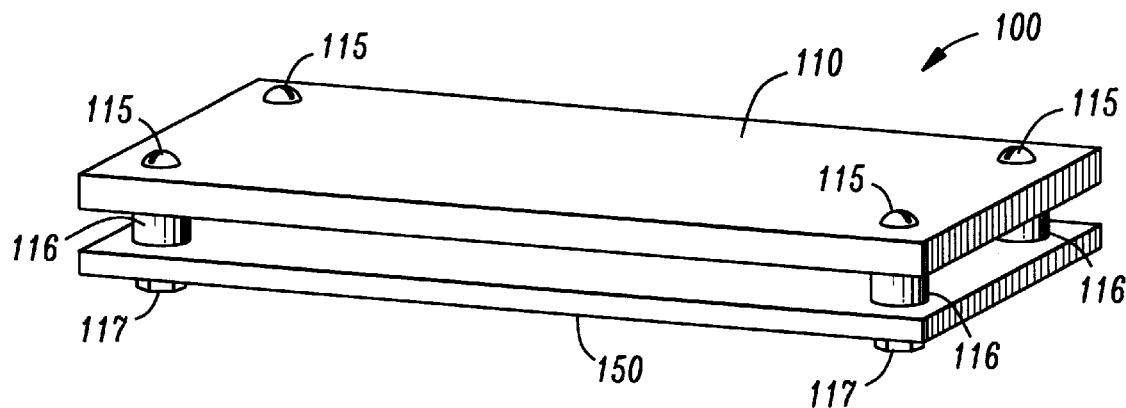
FIG. 1 illustrates a prior art heat sink and printed circuit or wiring board assembly.

Referring initially to FIG. 1, illustrated is a prior art assembly 100 consisting of a heat sink 110 in association with a printed circuit or wiring board 150 with a circuit mounted thereon that requires heat control. The heat sink 110 is fastened to the circuit board by small bolts 115 (pins, clips, screws, or other fastening means can also be used) inserted through holes drilled through the circuit board 150 and the heat sink 110 to accept the bolts 115. In order to maintain the required spacing between the circuit board 150 and the heat sink 110, spacers 116 are placed over each bolt 115 after the bolt 115 is inserted through the heat sink 110 or the circuit board 150, as the case may be, and before it is inserted through the other so that the spacer 116 is sandwiched between the circuit board 150 and the heat sink 110. The spacer 116 must be thick enough to keep the metallic heat sink 110 from contacting the circuit and components mounted on the printed wiring or circuit board 150. In order to hold the assembly 100 together, small mechanical nuts 117 are threaded on the bolts 115. As discussed above, these attachment methods, while usually effective, suffer from the disadvantage of increased cost due to increased number of parts and manufacturing time.

Figure 2A:
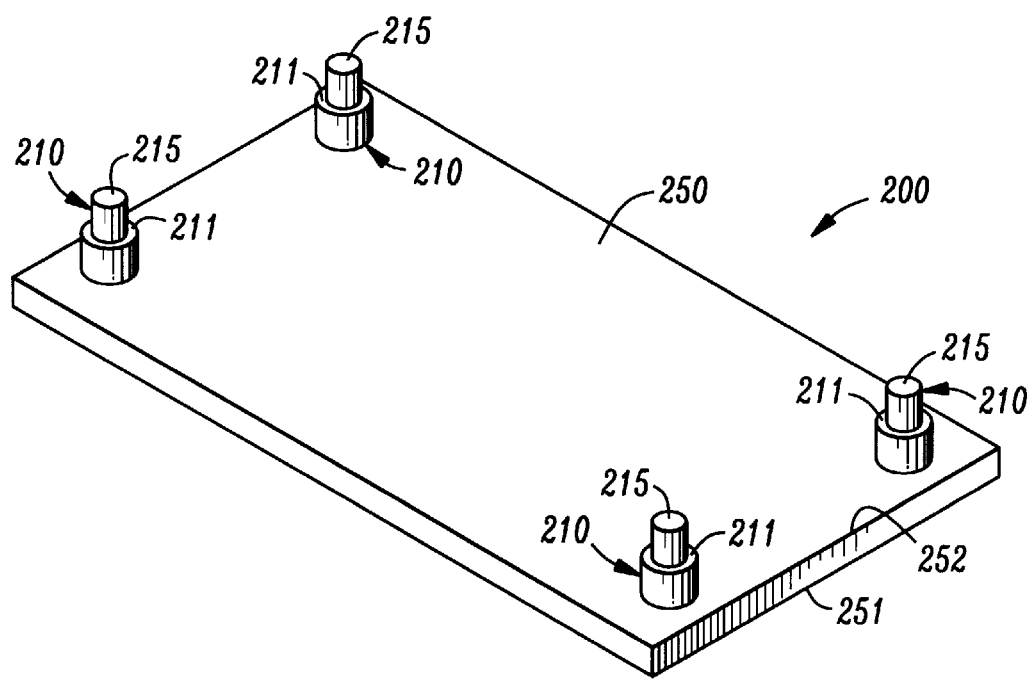
FIG. 2A illustrates an embodiment of the heat sink constructed in accordance with the present invention.
Figure 2B:
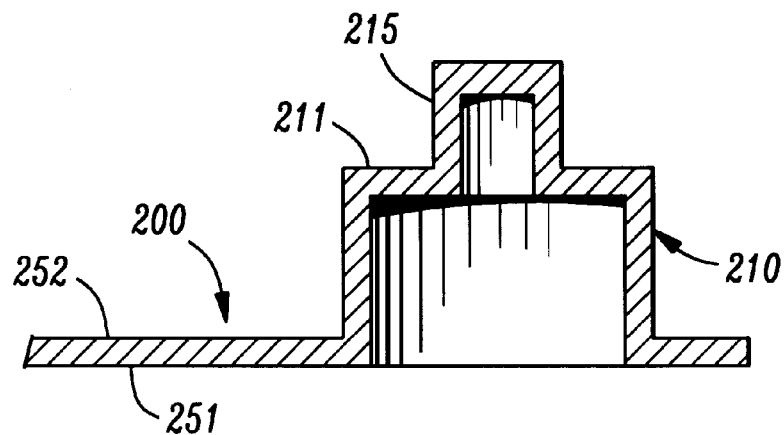
FIG. 2B illustrates a cross section view of the heat sink of FIG. 2A illustrating a double drawn support shoulder and button shoulder formed from the heat sink material.

Turning now to FIGS. 2A and 2B, illustrated is an embodiment of a heat sink 200 constructed in accordance with the principles of the present invention for use with a circuit board. The material used to make the illustrated heat sink 200 may be aluminum or an aluminum alloy. This material has particular use as a heat sink because of the heat transfer and malleability characteristics these materials. However, other malleable, thermal conducting materials known to those who are skilled in the art may also be used. The final size and shape of the heat sink 200 is determined by the circuit or wiring board with which it will be associated. In the advantageous illustrated embodiment, the heat sink 200 has a body 250 with a first side 251 and a second side 252. Support shoulders 210 of a predetermined first height are formed on the surface of the second side 252 out of the body 250 material. The predetermined first height is the distance from the surface of the second side 252 to the top of the support shoulder 210. The illustrated embodiment, the heat sink 200 has four support shoulders 210, one on each corner. Also formed out of the body 250 material, in the approximate center of each support shoulder 210, is a button shoulder 215 having a predetermined second height. The predetermined second height is the distance from the top of the support shoulder 210 to the top of the button shoulder 215.

Those skilled in the art will recognize that several variations of the illustrated heat sink 200 will be within the scope of the present invention. For example, as previously noted, materials other than aluminum or aluminum alloys can be used, and the heat sink 200 can be made in a variety of shapes other than that illustrated and may also have the support shoulders 210 and the button shoulders 215 formed in various patterns and numbers. The exact number and location of the support shoulders 210 and button shoulders 215 will be determined by the designer of the heat sink 200, depending on its intended application. In one embodiment, the button shoulder 215 may have an outer diameter that is less than an opening in a circuit board into which the button shoulder 215 will be inserted. In another embodiment, the support shoulder 210 may also serve as a spacer shoulder 211 with the height configured to provide the designed distance of separation between the heat sink 200 and the circuit board when the heat sink 200 is attached to the circuit board. In a similar fashion the height of the button shoulders 215 can be varied from a height that does not exceed the thickness of the circuit board to one that just exceeds the thickness of the circuit board.

Those who are skilled in the art will recognize that the illustrated heat sink 200 can be manufactured in a number of ways. For example, the heat sink 200 may be formed by molding, extruding, and casting processes. In one particularly advantageous embodiment, the heat sink 200 is manufactured using a progressive die press. In this particular embodiment, the heat sink 200 is formed by punch and die operations. For such die press operations, the heat sink body 250 is preferably a flat piece of metal that is subjected to two punch and die operations. The heat sink 200 is first held in a die and a press is used to apply punch pressure to the first side 251 of the heat sink body 250 with sufficient force to cause a portion of the heat sink body 250 to protrude from the second side 252 of the body 250, forming support shoulders 210 of a predetermined height. In the illustrated embodiment support shoulders 210 have been formed at each corner of the heat sink 200. The number of support shoulders 210 and their height and diameter can be varied depending on the die design used to shape and form the shoulders 210.

After the shoulders 210 are formed, the heat sink body 200 is subjected to a second punch and die operation. This operation is used to form the button shoulders 215 on the support shoulders 210. The heat sink 200 is held in a second die and a press is used to apply punch pressure to the support shoulder 210 on the first side 251 with sufficient force to cause a shoulder button 215 to protrude from the top of the support shoulder 210. The shoulder buttons 215 are smaller in diameter than the support shoulders 210 and generally will be pressed substantially from the center of each support shoulder 210 created in the first die and punch operation.

A result of forming the shoulder buttons 215 in the above described manner is that the shoulder buttons 201 have a spacer shoulder 211 that is formed at the junction of the bottom of each shoulder button 215 and the top of each support shoulder 210. This spacer shoulder 211 serves to maintain the desired separation between the heat sink 200 and the printed circuit or wiring board to which it is attached.

The foregoing manufacturing process results in an integral heat sink 200 formed from a single piece of material with the necessary features required to attach it to a printed circuit or wiring board. The button shoulders 215 serve as fastening pins that will be used to secure the heat sink 200 to a circuit or wiring board and the spacer shoulders 211 will maintain proper spacing between the surfaces of the heat sink 200 and the circuit or wiring board.

Figure 3A:
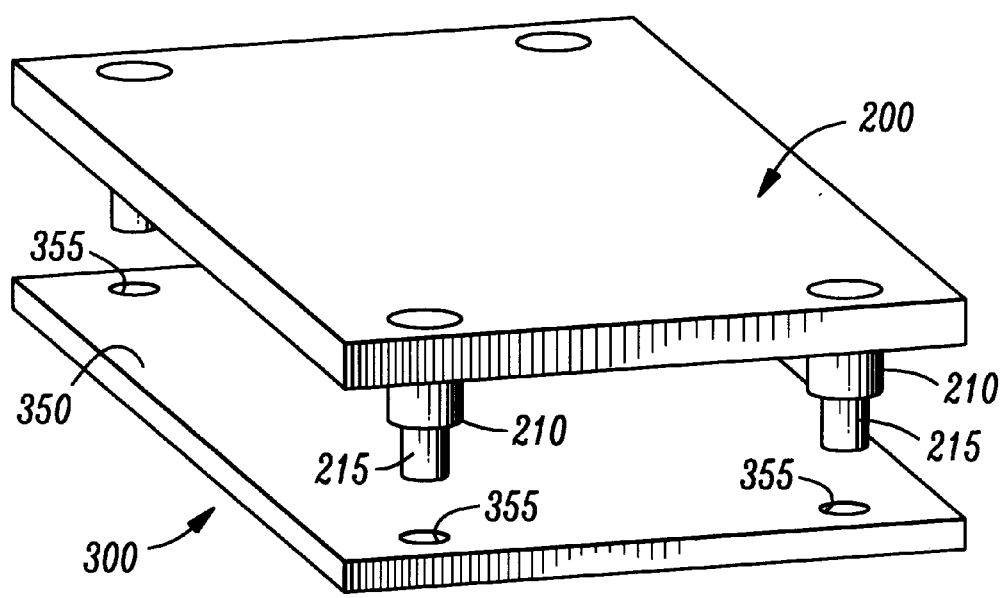
FIG. 3A illustrates a heat sink constructed in accordance with the present invention associated with a circuit board.
Figure 3B:
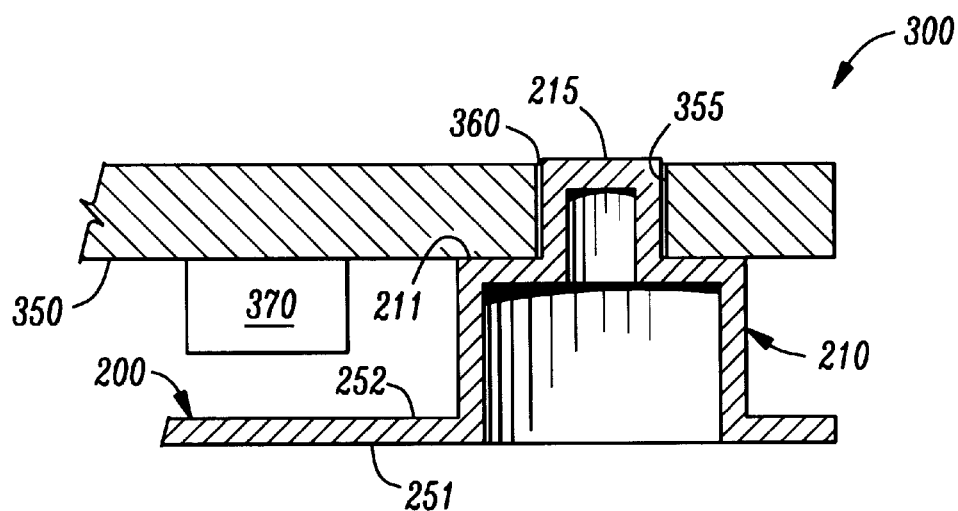
FIG. 3B illustrates a cross section view of the heat sink inserted into an opening formed in a circuit board.

Turning now to FIGS. 3A and 3B, illustrated is a printed circuit or wiring board 350 and a heat sink 200 combined into a module assembly 300. The printed circuit or wiring board 350 is manufactured with predetermined openings 355 that serve as fastening points where the heat sink 200 will be joined to the board 350. The heat sink 200 is located in opposition to the board 350 so that its shoulder buttons 215 are in opposition to and match the openings 355. Partial assembly is completed by inserting the button shoulders 215 through the openings 355. As shown, the outer diameter of the button shoulder 215 is just slightly less than the inside diameter of the opening 355 such that a space 360 is formed between the button shoulder 215 and the opening 355. The requisite amount of space between the board 350 and the board 350 is adequately spaced from the heat sink 200 and supported by the support shoulder 210. The support shoulder 210 provide enough spacing such that electrical components 370, which are attached to the side of the board 350 that opposes the heat sink 200, make appropriate contact with the heat sink 200 to properly conduct heat from the electrical components 370 to the heat sink 200. When completed, the module assembly 300 has the same basic configuration as the heat sink 110 and circuit board 120 illustrated in FIG. 1, but it will have been completed using substantially fewer parts and in substantially less time, thereby saving cost and increasing production efficiency.

Because the completed module assembly 300 has fewer parts, the final assembly process is substantially simplified from prior art processes. The manufacturing steps can be more easily automated, which makes the entire manufacturing process simpler, more efficient and less expensive. The end result will be a better product with a significant improvement in quality control.

Figure 4A:
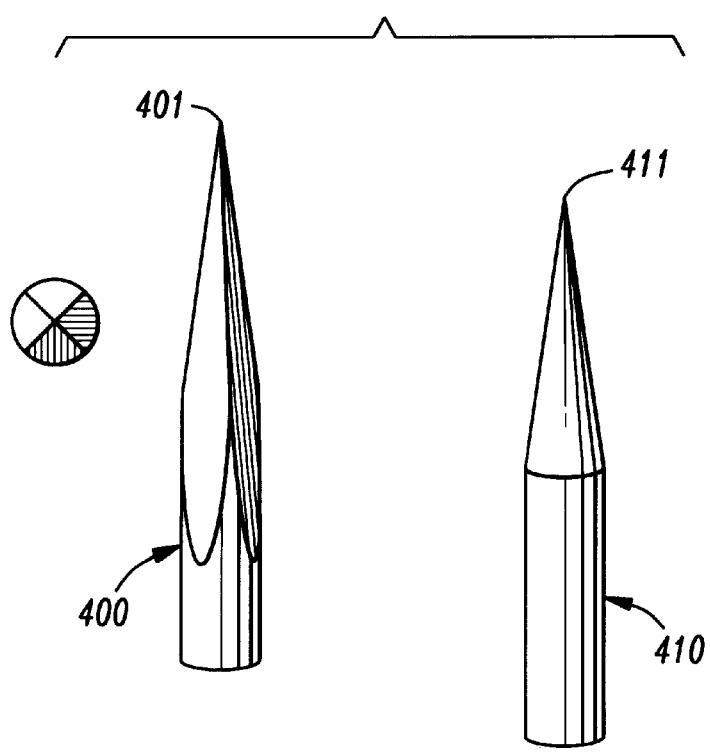
FIG. 4A illustrates a tool for flaring shoulder buttons on the heat sink to secure it to the circuit board.
Figure 4B:
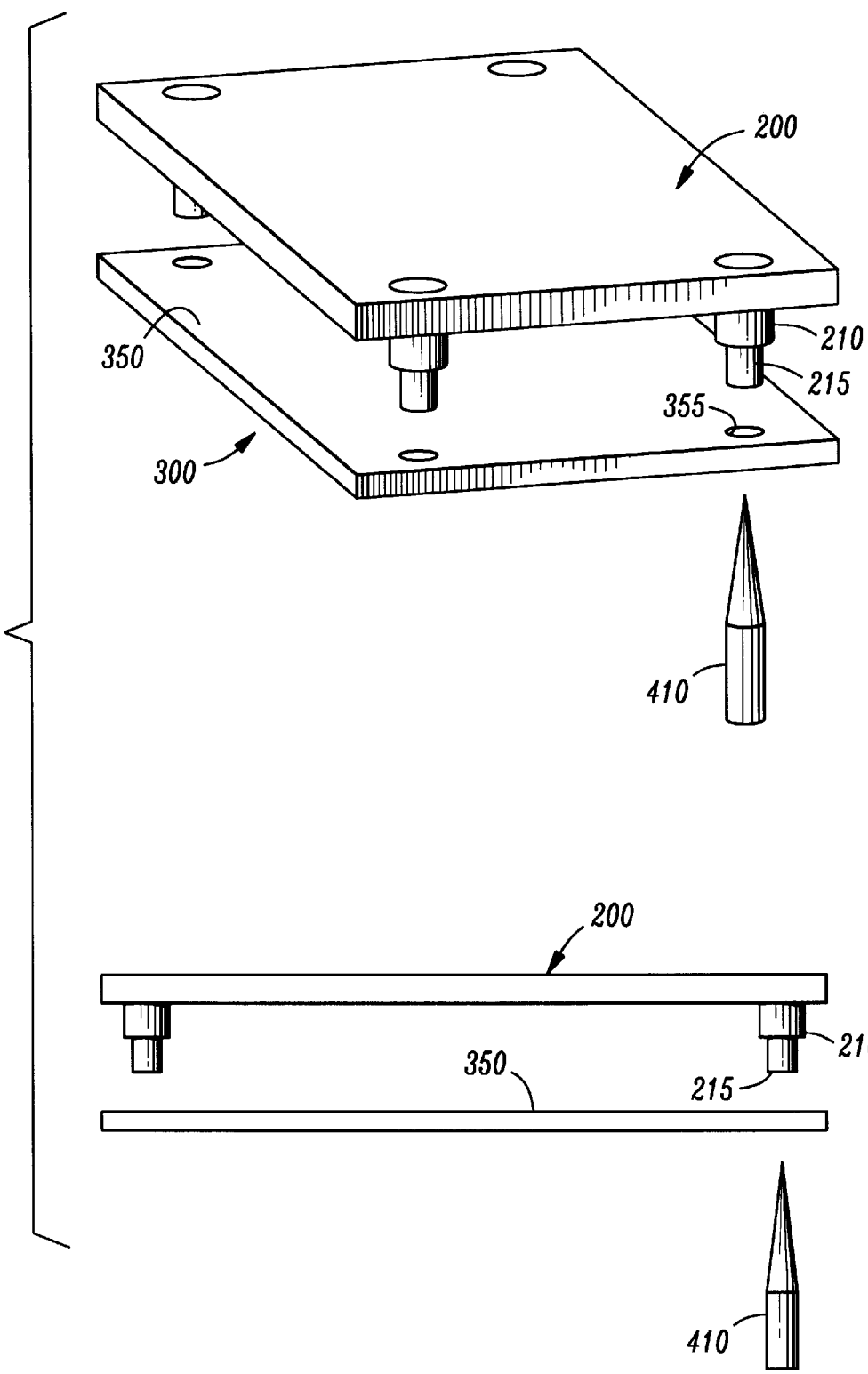
FIG. 4B illustrates the flaring tool positioned so that the shoulder buttons can be flared to secure the heat sink to a circuit board.
Figure 4C:
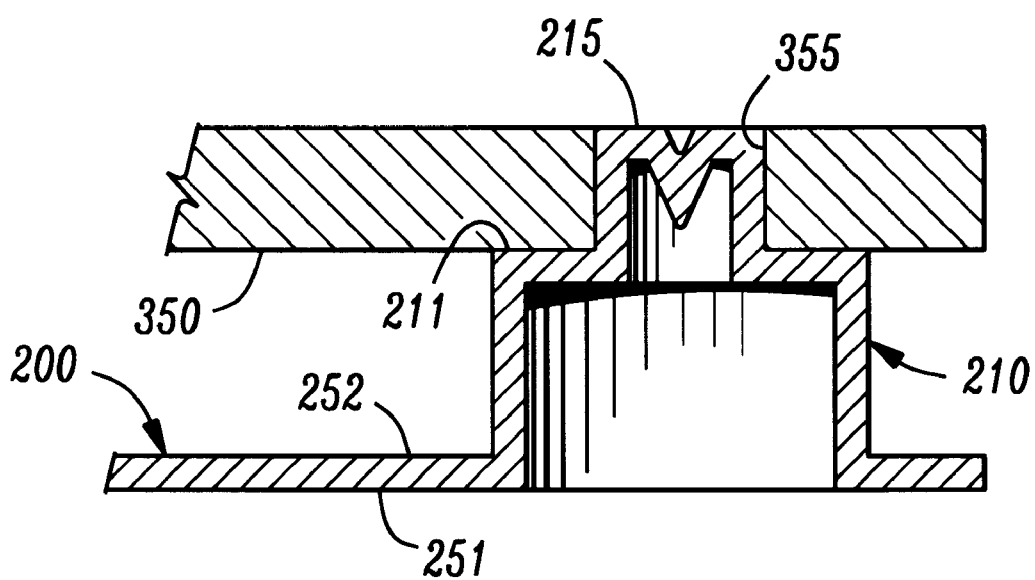
FIG. 4C illustrates a cross section view of the heat sink frictionally attached to a circuit board.

Turning now to FIGS. 4A, 4B and 4C, illustrated are flaring tools 400, 410 that can be used to secure the heat sink 200 and the board 350 illustrated in FIG. 3 together. The heat sink 200 may be attached to the board 350 by punching the button shoulder 215 with one of the flaring tools 400 to force the material of the button shoulder 215 outward and against the inside wall of the opening 355 as shown in FIG. 4C. When the heat sink 200 is attached to the circuit or wiring board 350 in this manner, it is held in place by a friction fit because the button shoulders 215 are slightly oversized by the flaring tools 400 or 410 so they hold the heat sink 200 on the board 350.

The end 401, 411 of the flaring tool 400, 410 can be of a variety of shapes, well known to those skilled in the art. The end 401, 411 of the tool 400, 410 is placed over the end of the tip of the shoulder button 215, after the button 215 is inserted through the opening 355. FIG. 4B illustrates the placement of the tool 400 over the tip of the pin 215. The tool 410 is then used to apply force to the tip of the button 215 causing the metal end of the button 215 to flare. The tip of the button 215 will be broadened and secure the heat sink 310 to the circuit board 350, as shown in FIG. 4C. Depending on how permanent a mount is required, the amount of flare can be varied. For example, if the heat sink 200 must be so secure that it will remain in place under adverse or extreme circumstances, such as, for example, where the module assembly 300 is used in a machine or vehicle subject to shocks or vibrations, the button 215 can be flared more deeply to provide a strong frictional holding force. In the more usual application a small flare will be used in order to permit maintenance personnel to remove the heat sink 200 with a twisting action of a small hand tool, such as a screwdriver, in order to obtain access to the board 350. In this way the valuable board 350 can be preserved and the more inexpensive heat sink 200 can be discarded and replaced.

In an alternative embodiment, the button shoulder 215 may be formed to form a tight frictional fit when inserted into the opening 355. In such instances, the heat sink 200 may be attached by applying enough force to force the button shoulder 215 through the opening 355. The tight fit between the button shoulder 215 and the opening 355 is adequate to firmly hold the heat sink 200 on the board 350.

Although the present invention has been described in detail, those skilled in the art should understand that they can make various changes, substitutions and alterations herein without departing from the spirit and scope of the invention in its broadest form.

What is claimed is:

1. A method of manufacturing a circuit board, comprising:
   forming a circuit board having an opening therein and a predetermined thickness;
   forming a heat sink body, including;
   forming a hollow support shoulder in said heat sink body by protruding a portion of the heat sink body to a predetermined first height; and
   forming a hollow button shoulder in said hollow support shoulder by protruding a portion of said support shoulder to a predetermined second height;
   inserting said protruding portion of said button shoulder into said opening; and
   applying a force against said protruding portion to increase a diameter thereof and effectuate a frictional holding force of said button shoulder against an interior diameter of said opening.

2. The method as recited in claim 1 wherein forming a support shoulder and a button shoulder includes forming a support shoulder and a button shoulder with a die press.

3. The method as recited in claim 1 wherein forming a heat sink body includes forming a heat sink body from aluminum.

4. The method as recited in claim 1 wherein forming a support shoulder includes forming a spacer shoulder having a protrusion height that provides a maximum design distance of separation between said heat sink and said circuit board.

5. The method as recited in claim 4 wherein forming a circuit board includes forming a printed wiring board and attaching an electrical component thereon, said electrical component extending from a heat sink mounting surface of said printed wiring board said maximum design distance, such that said electrical component is thermally coupled to said heat sink when said heat sink is mounted on said heat sink mounting surface.

6. The method as recited in claim 1 further comprising forming a plurality of support shoulders and a plurality of button shoulders and a plurality of openings in said circuit board.

7. The method as recited in claim 1 wherein forming said button shoulder to a predetermined second height includes forming a button shoulder to a height that does not substantially exceed said thickness of said circuit board.

8. A module assembly, comprising:
   a circuit board having an opening therein and a predetermined thickness and;
   a heat sink body coupled to said circuit board, including;
   a hollow support shoulder formed in said heat sink body and having a predetermined first height; and
   a hollow button shoulder formed in said hollow support shoulder and having a predetermined second height, said button shoulder passing into said opening and configured to be expanded to effectuate a frictional holding force of said button shoulder against an interior diameter of said opening.

9. The heat sink as recited in claim 8 said heat sink body comprises aluminum.

10. The heat sink as in claim 8 wherein said support shoulder is a spacer shoulder having a height configured to provide a maximum design distance of separation between said heat sink and said circuit board.

11. The heat sink as recited in claim 10 wherein said circuit board has an electrical component attached thereto, said electrical component extending from a heat sink mounting surface of said circuit board said maximum design distance such that said electrical component is thermally coupled to said heat sink when said heat sink is mounted on said heat sink mounting surface.

12. The heat sink as recited in claim 8 wherein said predetermined second height does not substantially exceed said thickness of said circuit board.

* * * * *